(12) United States Patent
Watt

(10) Patent No.: US 9,046,573 B1
(45) Date of Patent: Jun. 2, 2015

(54) ADDRESSABLE TEST ARRAYS FOR CHARACTERIZING INTEGRATED CIRCUIT DEVICE PARAMETERS

(71) Applicant: Altera Corporation, San Jose, CA (US)

(72) Inventor: Jeffrey T. Watt, Palo Alto, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 14/137,772

(22) Filed: Dec. 20, 2013

Related U.S. Application Data

(60) Provisional application No. 61/887,217, filed on Oct. 4, 2013.

(51) Int. Cl.
*G06F 17/50* (2006.01)
*G01R 31/3177* (2006.01)

(52) U.S. Cl.
CPC ........ *G01R 31/3177* (2013.01); *G06F 17/5045* (2013.01)

(58) Field of Classification Search
None
See application file for complete search history.

(56) References Cited

U.S. PATENT DOCUMENTS

| | | | |
|---|---|---|---|
| 4,633,220 A * | 12/1986 | Burgess | 341/136 |
| 5,438,295 A | 8/1995 | Reddy et al. | |
| 6,874,110 B1 * | 3/2005 | Camarota | 714/733 |
| 7,584,390 B2 * | 9/2009 | Vorbach et al. | 714/718 |
| 7,644,385 B1 | 1/2010 | Boyle et al. | |
| 7,859,354 B1 | 12/2010 | Chen et al. | |
| 2012/0074981 A1 * | 3/2012 | Luo et al. | 324/762.09 |

OTHER PUBLICATIONS

Pelgrom et al., "Matching Properties of MOS Transistors," IEEE Journal of Solid-State Circuits, vol. 24, No. 5, Oct. 1989, pp. 1433-1440.*
Tuinhout et al., "Parametric Mismatch Characterization for Mixed-Signal Technologies," IEEE Journal of Solid-State Circuits, vol. 45, No. 9, Sep. 2012, pp. 1687-1696.*
Lefferts et al., "An Integrated Test Chip for the Complete Characterization and Monitoring of a 0.25 mm CMOS Technology that fits into five scribe line structures 150 mm by 5,000 mm," ICMTS 2003 IEEE, pp. 59-63.*
Kuhn et al., "Process Technology Variation," IEEE Trans. on Electron Devices, vol. 58, No. 8, Aug. 2011, pp. 2197-2208.*
Tsunomura et al., "Verification of Threshold Voltage Variation of Scaled Transistors with Ultralarge-Scale Device Matrix Array Test Element Group," Japanese Journal of Applied Physics, 2009, vol. 48, No. 124505, 4 pages.*
Tsuji et al., "Measurement of MOSFET C-V Curve Variation Using CBCM Method," 2009 IEEE, pp. 81-84.*

(Continued)

*Primary Examiner* — Leigh Garbowski
(74) *Attorney, Agent, or Firm* — Treyz Law Group; Jason Tsai

(57) ABSTRACT

Test circuitry for characterizing manufacturing variations in semiconductor devices is provided. The test circuitry may include an array of devices under test and associated decoder circuitry for addressing the array of devices under test. In one arrangement, the test circuitry may be formed on a wafer at a scribe line located between adjacent integrated circuit dies on the wafer. In another arrangement, the test circuitry may be formed within an integrated circuit to provide on-chip variation monitoring capabilities. A measurement circuit may be used to gather test data from the array of devices under test and may be used to generate control signals that compensate for the manufacturing variations detected in the array of devices under test.

18 Claims, 13 Drawing Sheets

(56) References Cited

OTHER PUBLICATIONS

Oishi et al., "A Novel Structure of MOSFET Array to Measure Off-Leakage Current with High Accuracy," 2011 IEEE, pp. 14-17.*

Ohkawa et al., "Analysis and Characterization of Device Variations in an LSI Chip Using an Integrated Device Matrix Array," IEEE Trans. on Semiconductor Manufacturing, vol. 17, No. 2, May 2004, pp. 155-165.*

Okagaki et al., "Tr Variance evaluation induced by probing pressure and its stress extraction methodology in 28nm High-K Metal Gate process," 2013 IEEE Int. Conf. Microelectronic Test Structures, pp. 203-206.*

Ketchen et al., "Addressable Arrays Implemented with One Metal Level for MOSFET and Resistor Variability Characterization," 2009 IEEE, pp. 13-18.*

Katayama et al., "Direct Cell-Stability Test Techniques for an SRAM Macro with Asymmetric Cell-Bias-Voltage Mudulation," 2008 IEEE International Test Conference, Paper 25.1, 7 pages.*

Ji et al., "Operational Amplifier Based Test Structure for Transistor threshold Voltage Variation," 2008 IEEE Conference on Microelectronic Test Structure, pp. 3-7.*

Hiramoto et al., "Direct Measurement of Correlation Between SRAM Noise Margin and Individual Cell Transistor Variability by Using Device Matrix Array," IEEE Trans. on Electron Devices, vol. 58, No. 8, Aug. 2011, pp. 2249-2256.*

Hess et al., Device Array Characterization Vehicle Test Chip for Ultra Fast Product Wafer Variability Monitoring,: 2007 IEEE Int'l Conference on Microelectronic Test Structures, pp. 145-149.*

Guo et al., "Large-Scale SRAM Variability Characterization in 45 nm CMOS," IEEE Journal of Solid-State Circuits, vol. 44, No. 11, 2009, pp. 3174-3192.*

Deng et al., "Characterization of Bit Transistors in a Functional SRAM," 2008 Symposium on VLSI Circuits Digest of Technical Papers, pp. 44-45.*

Izumi et al., "Evaluation of Transistor Property Variations Within Chips on 300-mm Wafers Using a New MOSFET Array Test Structure", IEEE Transactions on Semiconductor Manufacturing, vol. 17, No. 3, Aug. 2004, 7 pages.

Chagawa et al., "Measurement of the MOSFET Drain Current Variation Under High Gate Voltage", IEEE Conference on Microelectronic Test Structures, Mar. 24-27, 2008, Edinburgh, United Kingdom, 4 pages.

Xu et al., "Investigation of 65 nm CMOS transistor local variation using a FET array", Solid-State Electronics, Jul. 2008, 5 pages.

* cited by examiner

US 9,046,573 B1

ADDRESSABLE TEST ARRAYS FOR CHARACTERIZING INTEGRATED CIRCUIT DEVICE PARAMETERS

This application claims the benefit of provisional patent application No. 61/887,217 filed Oct. 4, 2013, which is hereby incorporated by reference herein in its entirety.

BACKGROUND

This invention relates to integrated circuits, and more particularly, to taking into account manufacturing variations to minimize performance variations in integrated circuits.

Due to variations in manufacturing processes, individual integrated circuit dies of the same type do not perform identically. For example, some devices may operate reliably at faster speeds than other devices. Sometimes manufacturers sell parts that perform differently as different parts. With this type of approach, fast parts might, as an example, have a different model designation than slow parts and might be sold at a premium price relative to slow parts.

In an effort to quantify such types of manufacturing variations, test structures are fabricated on the same wafer in which the integrated circuits are formed to characterize the performance of the integrated circuit dies. In one conventional arrangement, the test structures include a relatively dense array of transistors under test. The array of transistors under test, however, are not addressable and do not provide accurate voltage/current sensing capabilities. In another conventional arrangement, the test structures include an addressable array of unit cells. Each unit cell, however, includes a substantial amount of control logic in addition to the transistor under test. As a result, the addressable array has low density and occupies a large portion of valuable wafer area.

SUMMARY

Test circuitry for characterizing the performance of semiconductor devices is provided. The test circuitry may include an array of devices under test and associated decoder circuitry for addressing the array of devices under test. Each device under test may include a single transistor, a single diode, a single resistor, a single capacitor, a single memory cell, or another electronic component that is directly coupled to the decoder circuitry.

In one suitable arrangement, the test circuitry may be formed on a wafer at a scribe line that separates two adjacent integrated circuit dies on the wafer. In this arrangement, external test equipment may be used to extract parametric data from the test circuitry on the wafer. In another suitable arrangement, the test circuitry may be formed on-chip as part of an integrated circuit. In this arrangement, an on-chip measurement circuit may be used to gather test data from the test circuitry. Data that is gathered from the test circuitry may be used to generate information that is used to compensate for the semiconductor manufacturing variations detected in the array of devices under test.

The decoding circuitry may be implemented using only pass transistors. The pass transistors may be used to form multiplexers. The decoding circuitry may include at least first and second decoding circuits formed along opposing sides of the array. Each of the first and second decoding circuits may include at least first and second decoding stages connected in series. The first and second decoding stages may include the same number of multiplexers.

In one embodiment, each device under test in a row of devices under test may have a terminal that is shorted to both the first and second decoding circuits. The first decoding circuit may be used to apply a signal to a selected one of the devices under test in that row, whereas the second decoding circuit may be used to sense a corresponding output signal from the selected device under test. Connected in this way, the decoding circuits provide the Kelvin measurement capability. In another embodiment, a device under test in a first column in the array may be controlled using the first decoding circuit, whereas a device under test in a second column in the array may be controlled using the second decoding circuit. Connected in this way, the density of devices under test in the array can be doubled.

Further features of the invention, its nature and various advantages will be more apparent from the accompanying drawings and the following detailed description.

DETAILED DESCRIPTION

Embodiments of the present invention relate to integrated circuits, and more particularly, to ways for characterizing and compensating for process, voltage, and/or temperature variations on an integrated circuit during manufacturing and normal operation. It will be recognized by one skilled in the art, that the present exemplary embodiments may be practiced without some or all of these specific details. In other instances, well-known operations have not been described in detail in order not to unnecessarily obscure the present embodiments.

Figure 1:
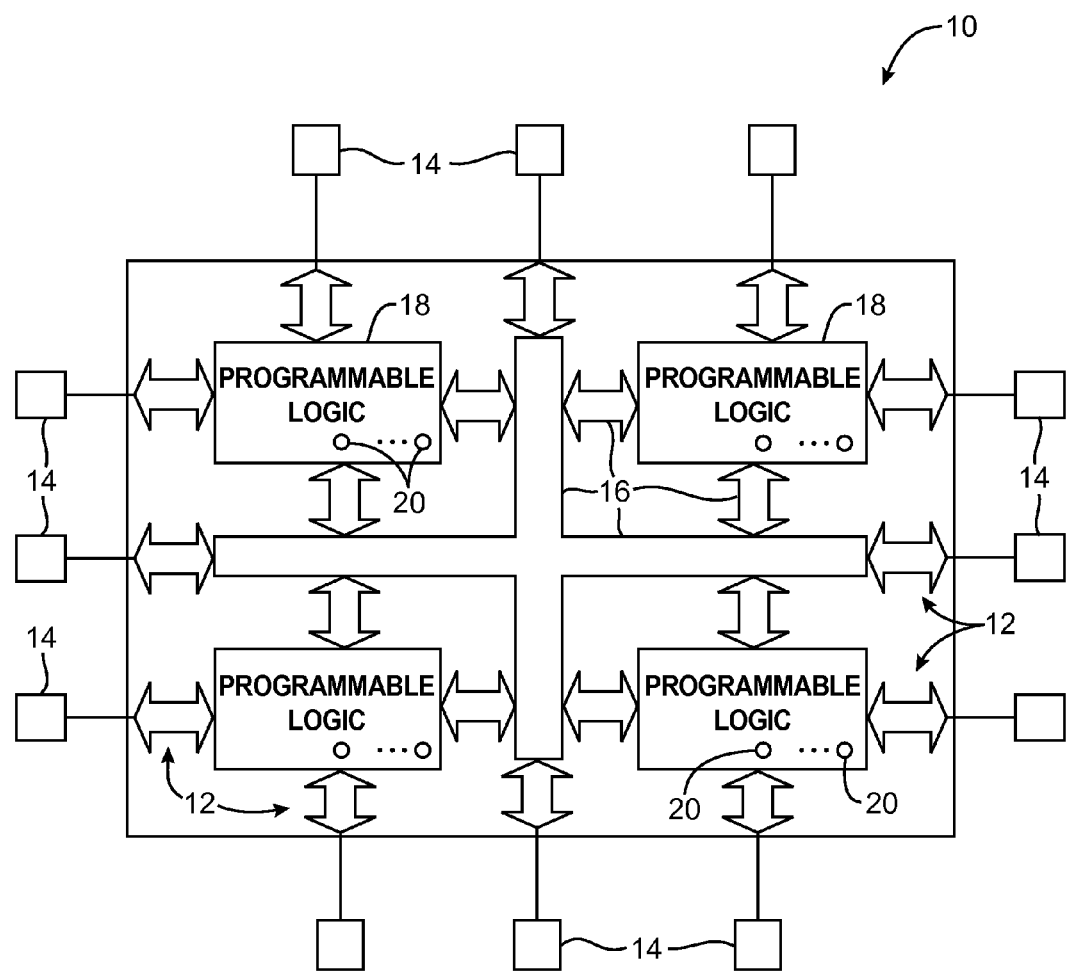
FIG. 1 is an illustrative programmable integrated circuit in accordance with an embodiment of the present invention.

An illustrative integrated circuit of the type that may be tested is shown in FIG. 1. As shown in FIG. 1, integrated circuit 10 may contain memory elements 20. Memory elements 20 may be loaded with configuration data to configure programmable transistors such as pass transistors (sometimes referred to as pass gates or pass gate transistors) in programmable circuitry such as programmable logic 18.

Because memory elements 20 may be used in storing configuration data for programmable logic 18, memory elements 20 may sometimes be referred to as configuration random-access memory (CRAM) cells. Integrated circuit 10 may be configured to implement custom logic functions by configuring programmable logic 18. As a result, integrated circuit 10 may sometimes be referred to as a programmable integrated circuit or a programmable logic device (PLD) integrated circuit.

As shown in FIG. 1, programmable integrated circuit 10 may have input-output (I/O) circuitry 12 for driving signals off of device 10 and for receiving signals from other devices via input-output pins 14. Interconnection resources 16 such as global and local vertical and horizontal conductive lines and buses may be used to route signals on device 10. Interconnection resources 16 may include fixed interconnects (conductive lines) and programmable interconnects (i.e., programmable connections between respective fixed interconnects).

Programmable logic 18 may include combinational and sequential logic circuitry. Programmable logic 18 may be configured to perform a custom logic function. The programmable interconnects associated with interconnection resources 16 may be considered to form a part of programmable logic 18.

When memory elements 20 are loaded with configuration data, the memory elements each provide a corresponding static control output signal that controls the state of an associated logic component in programmable logic 18. The memory element output signals may, for example, be used to control the gates of metal-oxide-semiconductor (MOS) transistors such as n-channel metal-oxide-semiconductor (NMOS) pass transistors in programmable components such as multiplexers, logic gates such as AND gates, OR gates, XOR gates, NAND gates, NOR gates, etc. P-channel transistors (e.g., a p-channel metal-oxide-semiconductor pass transistor) may also be controlled by output signals from memory elements 20, if desired.

When a memory element output that is associated with an NMOS pass transistor is high, the pass transistor controlled by that memory element is turned on and passes logic signals from its input to its output. When the memory element output is low, an NMOS pass transistor is turned off and does not pass logic signals. P-channel metal-oxide-semiconductor (PMOS) pass transistors are turned on when the signal that is applied to its gate from the output of a memory element is low (e.g., 0 volts) and are turned off when the output of the memory element is high (i.e., the polarity for NMOS and PMOS control signals is reversed).

Configuration random-access memory elements 20 may be arranged in an array pattern. There may be, for example, millions of memory elements 20 on integrated circuit 10.

During programming operations, the array of memory elements is provided with configuration data. Once loaded with configuration data, memory elements 20 may selectively control (e.g., turn on and off) portions of the circuitry in the programmable logic 18 and thereby customize the circuit functions of circuit 10.

The circuitry of programmable integrated circuit 10 may be organized using any suitable architecture. As an example, the circuitry of programmable integrated circuit 10 may be organized in a series of rows and columns of programmable logic blocks (regions) each of which contains multiple smaller logic regions. The logic resources of integrated circuit 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the circuitry of programmable integrated circuit 10 may be arranged in more levels or layers in which multiple large regions are interconnected to form still larger portions of logic. Still other device arrangements may use logic that is not arranged in rows and columns.

Modern semiconductor fabrication techniques of the type that are used to produce programmable integrated circuits of the type described in connection with FIG. 1 involve numerous individual process steps, such as material deposition, etching, polishing, oxidation, doping, annealing, patterning, etc. Processing variations that occur when performing these steps lead to deviations from target performance for the finished components on an integrated circuit. For example, the polysilicon gate conductors associated with transistors on device 10 may have widths that are larger or smaller than their expected nominal values. Oxide thicknesses may be smaller or larger than expected while doping concentrations may vary. These variations lead to variations in device characteristics (sometimes referred to as "process variations"). For example, the threshold voltages of n-channel and p-channel metal-oxide-semiconductor transistors may be larger or smaller than nominal values, various resistances and capacitances may be larger or smaller than expected, etc.

Variations in the components on an integrated circuit affect circuit performance. For example, devices such as transistors may switch faster or slower than expected, leading to unexpectedly short or long delays as signals traverse paths on the integrated circuit. Transistor saturation currents may be larger or smaller than nominal values, leading to variations in circuit performance such as buffer drive currents that are smaller or larger than expected or voltage supply levels that are smaller or larger than nominal values.

Because processing variations lead to unexpected variations in circuit performance, considerable efforts are made to ensure that manufacturing processes are well controlled. There are practical limits, however, to how much processes can be controlled. If too much weight is placed on reducing process variations, yields will suffer. For a process to be economically viable, some process variations must be accepted.

In accordance with an embodiment, an integrated circuit such as programmable device 10 may be tested during manufacturing or during normal device operation to determine its performance characteristics (i.e., slow, fast, low or high currents, low or high voltages, etc.). Following testing, suitable steps may be taken to compensate for any undesired performance variations that has been detected during test. As an example, device 10 may be configured to operate at higher power supply voltage levels in response to determining that measured device parameters are too slow. As another example, device 10 may be configured to operate at relatively lower power supply voltage levels in response to determining that measured devices consume too much power. As yet another example, device 10 may be configured to adjust transistor back gate bias (e.g., to adjust transistor threshold voltages) in response to determining that the measured device parameters fail to satisfy design criteria.

Figure 2:
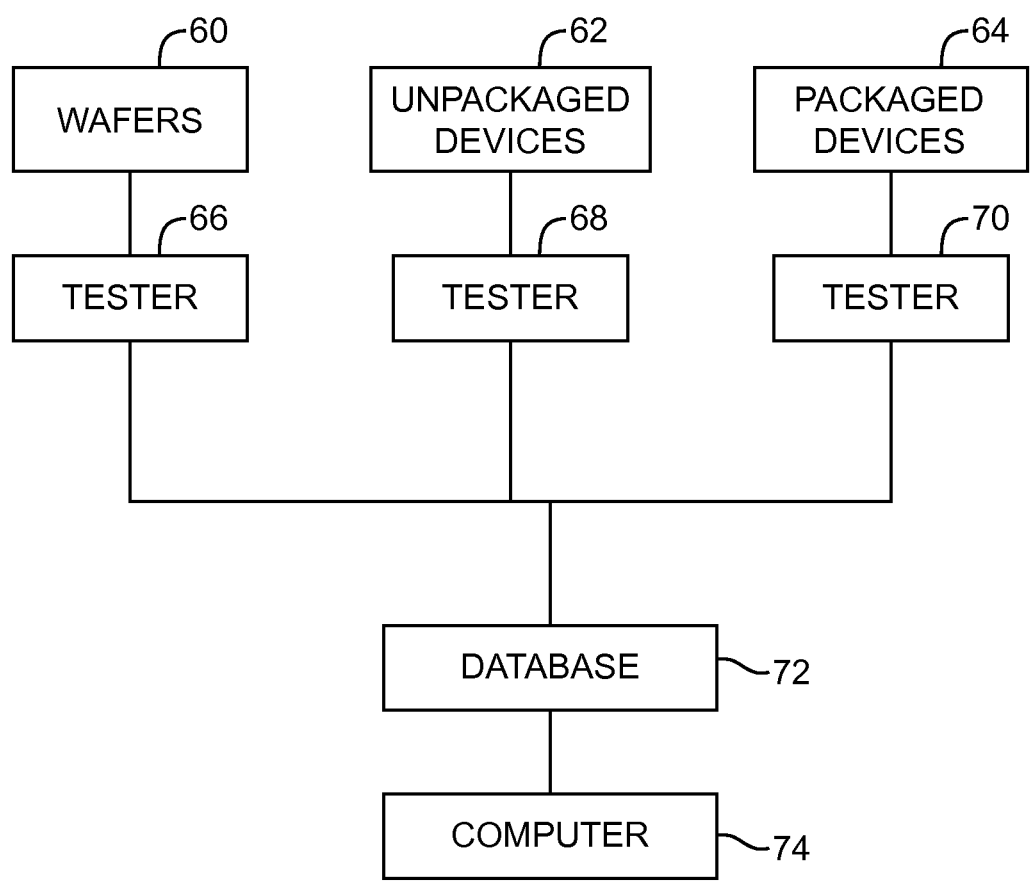
FIG. 2 is a diagram of an illustrative system environment in which testing is performed to characterize manufacturing variations in accordance with an embodiment of the present invention.

Integrated circuits can be tested during various stages of manufacturing (see, e.g., FIG. 2). As shown in FIG. 2, integrated circuits dies may be tested when they are still part of a wafer 60, before being assembled in a package (i.e., when the integrated circuit dies are still unpackaged dies 62), or after being assembled in a package 64. Tester 66 may include probe heads appropriate for probing corresponding test pads on wafers 60. Tester 66 may also have probe heads that are used to probe test devices on wafers 60 that are not part of any die on the wafer.

Figure 3:
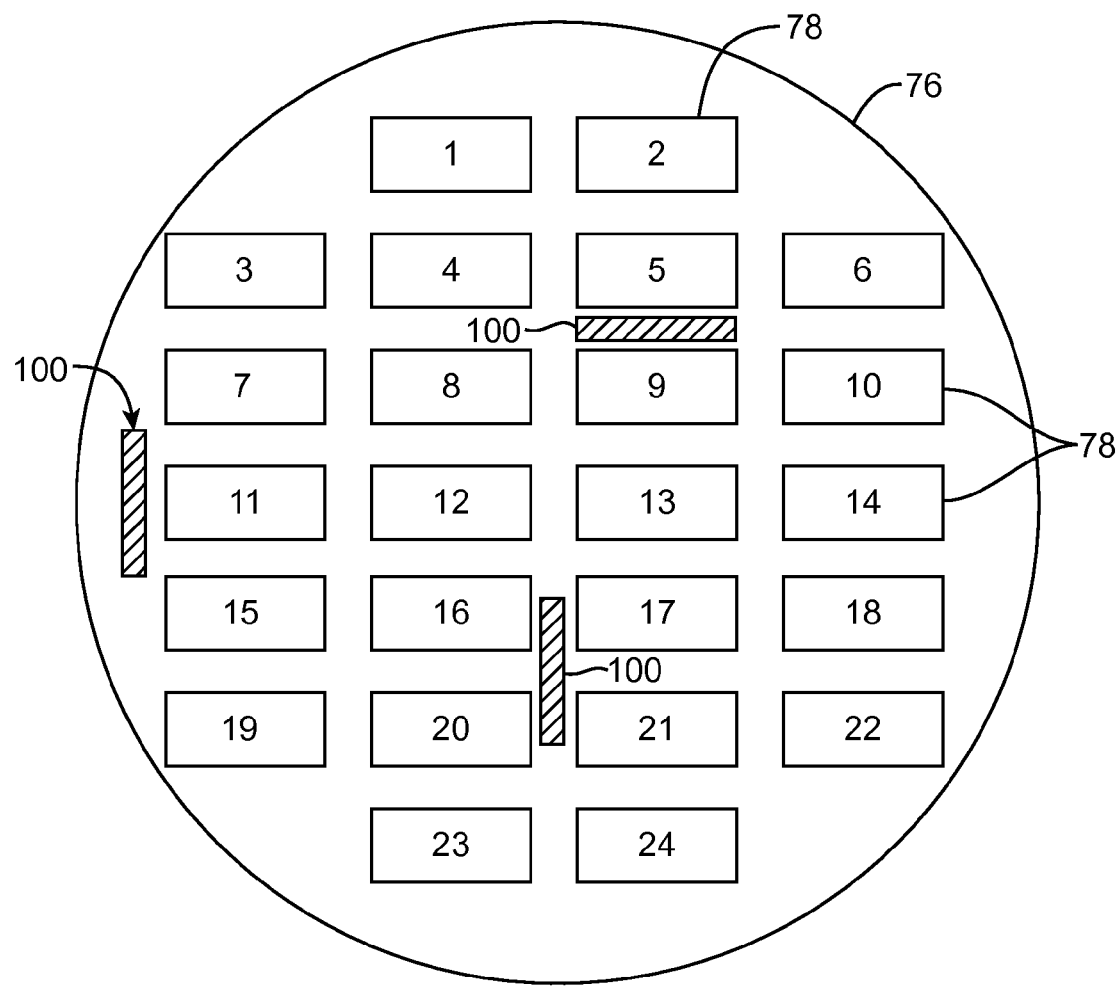
FIG. 3 is a top view of an illustrative silicon wafer containing multiple integrated circuit dies and scribe line test structures whose performance can be measured to characterize the integrated circuit dies in accordance with an embodiment of the present invention.

An illustrative wafer 76 is shown in FIG. 3. As shown in FIG. 3, wafer 76 may include a number of integrated circuits 78, at least some of which may be programmable integrated circuits. Test blocks 100 may be located in the interstitial spaces between devices 78. There are three test blocks 100 shown in the example of FIG. 3, but in general there may be any suitable number of blocks 100. The interstitial locations of blocks 100 are sometimes referred to as "scribe-line" locations, because the gaps between dies 78 on a wafer are sometimes used for forming scribe lines to facilitate dicing of the wafer. In general, scribe line test blocks 100 may include n-channel and p-channel metal-oxide-semiconductor transistors, bipolar junction transistors, diodes, capacitors, resistors, and other test structures. These devices can be tested without involving dies 78. Each test block 100 may sometimes be referred to herein as a circuit block under test 100.

Tester 68 of FIG. 2 may be used to make measurements on unpackaged devices. Packaged devices 64 may be tested using tester 70. Testers such as testers 66, 68, and 70 can contain probe heads and fixtures for forming electrical connections to circuit blocks under test 100. Testers 66, 68, and 70 may be a parametric tester (as an example) that can be used to apply desired voltage/current stress to the structures under test via input pads and to measure the resulting voltage/current levels at corresponding output pads. Scan testing may also be performed. If desired, timing tests may be performed by measuring the minimum delay associated with propagating a digital signal from one register to another (so-called register-to-register testing).

The results of the tests performed by testers 66, 68, and 70 may be stored in database 72. A computer system 74 may be used to process the collected manufacturing measurements.

Figure 4:
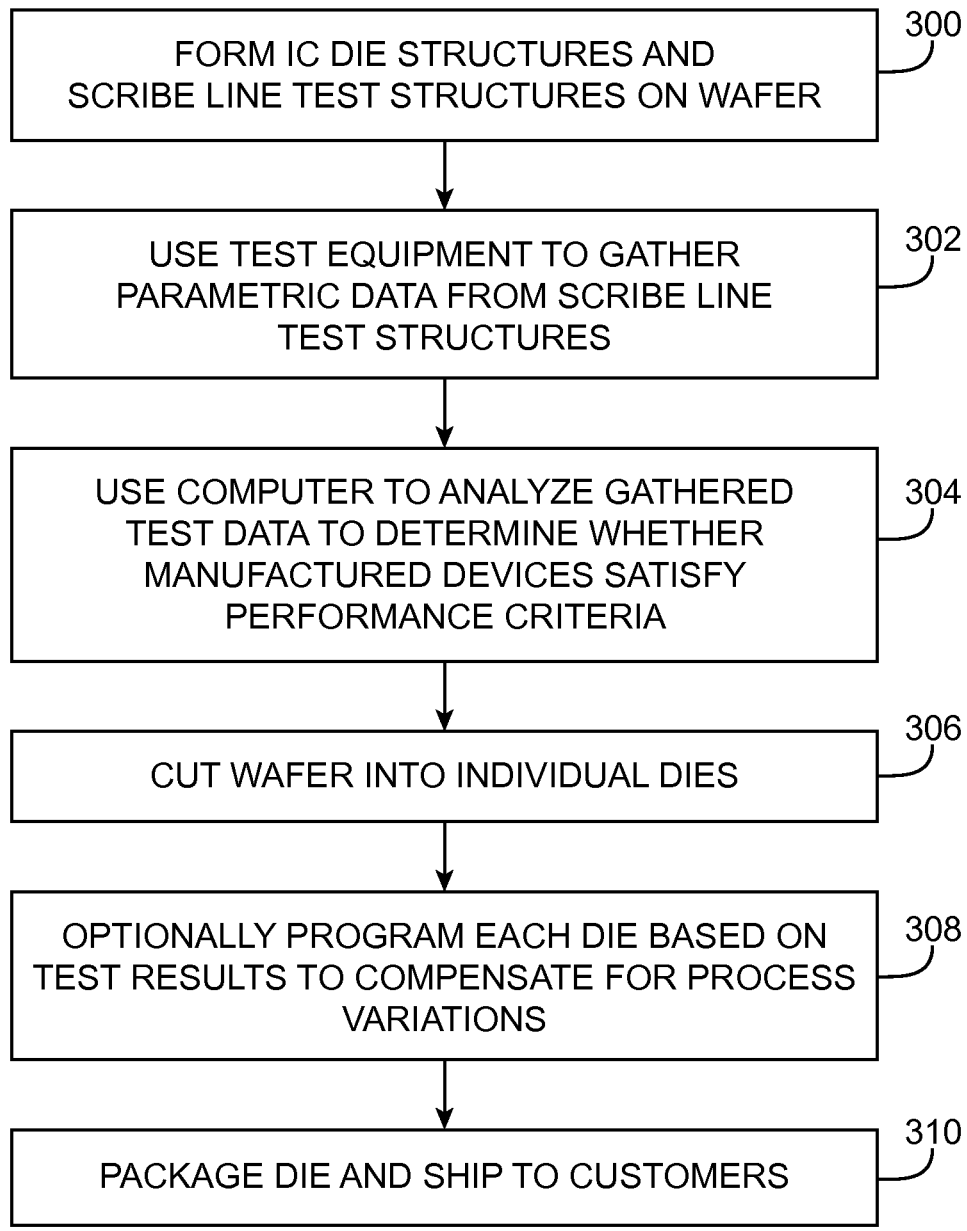
FIG. 4 is a flow chart of illustrative steps for handling circuitry of the type shown in FIG. 3 in accordance with an embodiment of the present invention.

Illustrative steps involved in using the equipment of FIG. 2 to characterize integrated circuit devices on a wafer are shown in FIG. 4. At step 300, integrated circuit dies 78 and scribe-line test circuit blocks 100 are formed on a wafer. At step 302, test equipment such as parametric testers may be used to gather parametric data from test circuit blocks 100. At step 304, computer 74 may be used to analyze the gathered test data to determine whether the devices formed on the wafer satisfy performance criteria. For example, by measuring an on current that flows through a large sample of test transistors in block 100, the performance of logic circuitry on dies 78 may be estimated. In other words, the performance of devices on dies 78 can be effectively characterized by measuring representative test structures in block 100.

At step 306, the wafer may be diced into individual dies. At step 308, each die may be optionally programmed based on the test results to compensate for any process variations. For example, when the measured results are reflective of weaker transistors, at least some non-volatile memory such as fuse circuitry on a die 78 may be programmed (or selectively blown) so that die 78 operates at a higher regulated voltage level to compensate for the reduced drive strength of the weaker transistors. At step 310, the programmed die may then be packaged and shipped to customers.

Figure 5:
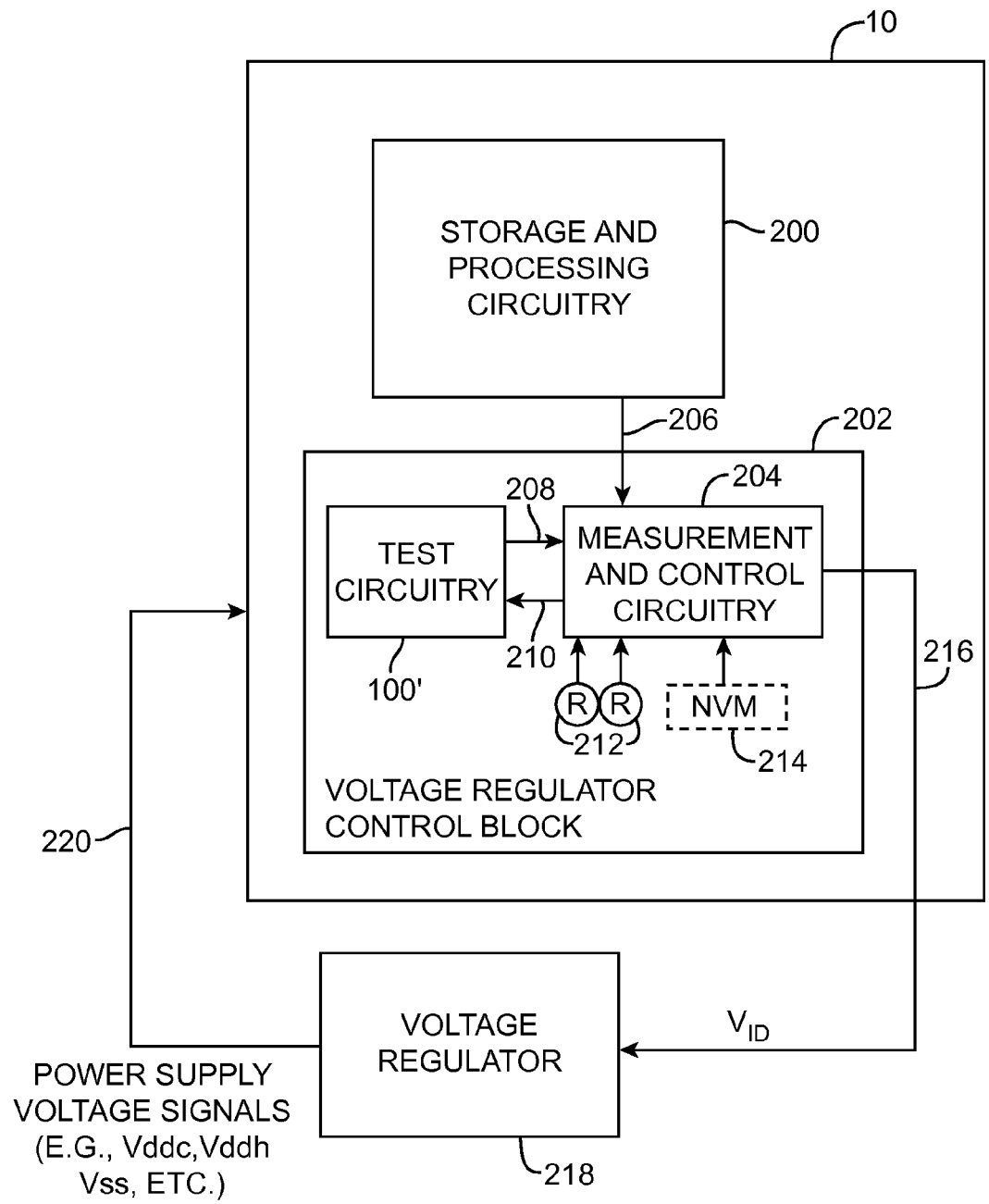
FIG. 5 is a diagram of an illustrative integrated circuit that includes a voltage regulator control block having test circuitry whose performance can be measured to characterize other devices on the integrated circuit in accordance with an embodiment of the present invention.

In another suitable arrangement, the structures under test may be formed on-chip (see, e.g., FIG. 5). As shown in FIG. 5, device 10 may include storage and processing circuitry 200 that is coupled to a voltage regulator control block 202. Storage and processing circuitry 200 may include memory circuitry, logic circuits, arithmetic circuits, and/or other (digital or analog) control circuitry that serve to implement the desired function of integrated circuit 10.

Storage and processing circuitry 200 may periodically or aperiodically send an enable signal to voltage regulator control block 202 via control path 206. The enable signal may direct control circuitry within block 202 to initiate on-chip testing, test data analysis, and performance compensation. In the example of FIG. 5, voltage regulator control block 202 may include an on-chip test block such as test circuitry 100' and measurement and control circuitry 204. Test circuitry 100' may be similar to test block 100 of the type described in connection with FIG. 3.

Control circuitry 204 may send control signals such as address signals and appropriate power supply voltage signals to test block 100' to obtain measurements from a desired portion of test block 100'. Resulting test signals may be fed back to measurement circuitry 204 via test path 208. Circuitry 204 may then analyze the test results and generate optimized operating settings that take into account the power and performance requirements of the particular user application.

In the example of FIG. 5, voltage regulator control block 202 may serve to provide control signals $V_{ID}$ to an off-chip voltage regulator 218 via path 216. By adjusting the value of $V_{ID}$, voltage regulator 218 may provide varying power supply voltages to device 10. For example, by increasing $V_{ID}$, a positive power supply voltage signal Vddh may be elevated above core power supply voltage Vddc. As another example, ground power supply voltage signal Vss may be dropped below zero volts by decreasing $V_{ID}$.

Signals $V_{ID}$ may be adjusted based on settings provided to circuitry 204 using storage elements 212. As an example, storage element 212 may be a volatile memory element (e.g., a CRAM cell loaded with configuration data). The contents of elements 212 may be updated based on measurement results obtained using circuitry 204. The contents of memory elements 212 may also be set by a configuration file that is generated using an Electronic Design Automation (EDA) tool such as Altera's Quartus based on the design implemented on device 10 by the customer to control the algorithm used by circuitry 204. The contents of memory elements 212 may also be set by the manufacturer (e.g., by Altera via Quartus) to control the algorithm used by circuitry 204 in setting the regulator voltage.

In some embodiments, circuitry 204 may be controlled using nonvolatile memory elements 214 (e.g., NAND flash memory based on floating gate or charge trapping technology, NOR flash memory, erasable programmable read only memory ("EPROM"), electrically erasable programmable read only memory ("EEPROM"), ferroelectric RAM ("FRAM"), magneto resistive RAM ("MRAM"), phase change memory ("PCM"), or any combination thereof) that are programmed only once during manufacturing. Once programmed, the state of nonvolatile memory 214 is fixed and cannot be changed. In the scenario in which elements 214 are fuses, the fuses may be selectively blown based on measurement results obtained using circuitry 204. The fuses may also be selectively blown based on measurement results from scribe line test structures such as structures 100 shown in FIG. 3 or other test structures. In general, the fuses may be blown to control the algorithm used by circuitry 204 in setting the regulator voltage.

Figure 6:
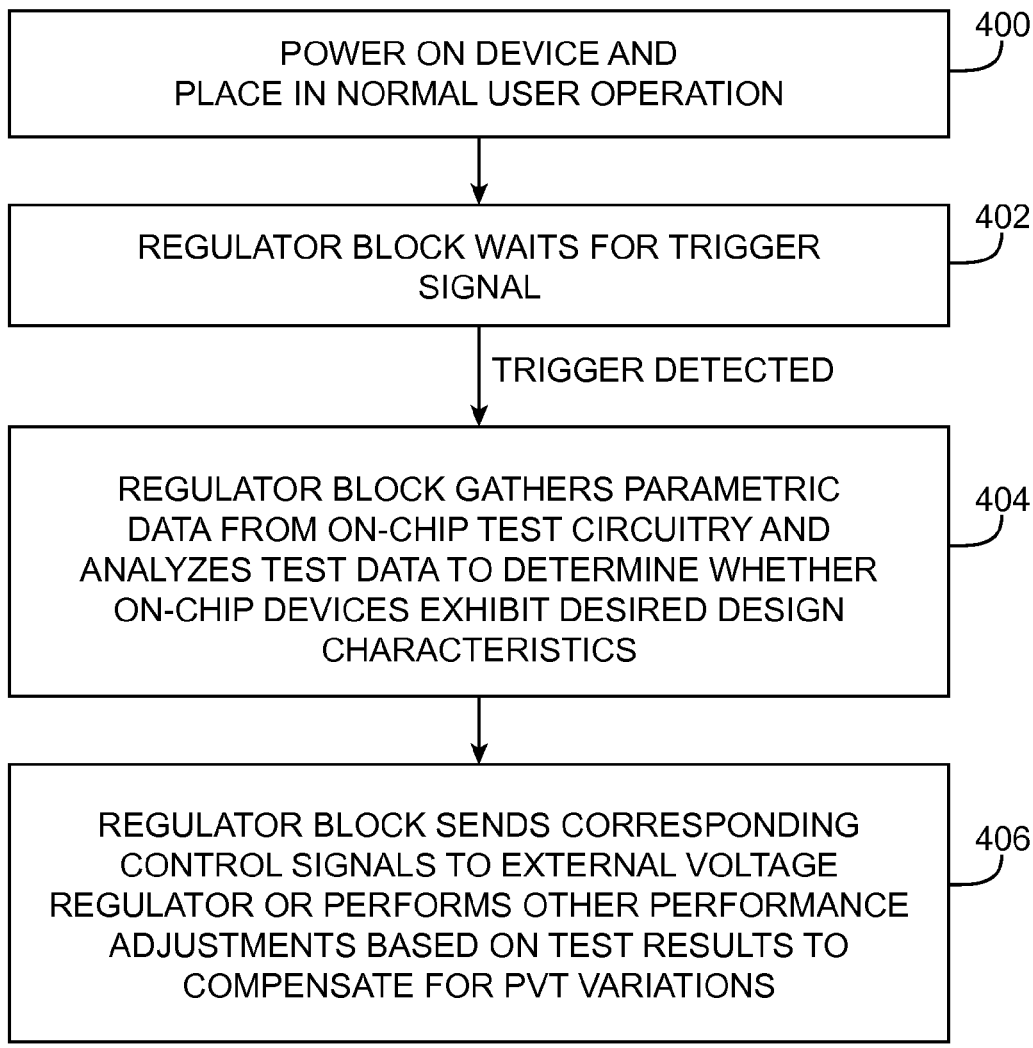
FIG. 6 is a flow chart of illustrative steps for operating an integrated circuit of the type shown in FIG. 5 in accordance with an embodiment of the present invention.

FIG. 6 is a flow chart of illustrative steps for operating an integrated circuit of the type described in connection with FIG. 5. At step 400, device 10 may be powered on and placed in normal user operation. At step 402, voltage regulator control block 202 may wait for an enable signal to trigger on-chip testing.

In response to receiving the enable signal, control block 202 may be used to gather parametric data from on-chip test block 100'. In particular, measurement and control circuitry 204 may analyze the test data and may determine whether other circuitry such as electrical components in storage and processing circuitry 200 exhibit desired design characteristics. For example, if the measured test data exhibits high current levels, transistors in storage and processing circuitry 200 will probably be free of timing errors. However, if the measured test data exhibits low current levels, the transistors in storage and processing circuitry 200 will probably violate target timing margins.

Depending on the measured results, voltage regulator block 202 may send appropriate control signals to external voltage regulator 218 to adjust the power supply voltage level that is being supplied to device 10 to compensate for any detected process, voltage, and/or temperature variations (sometimes referred to as "PVT" variations). This example in which the test results are being used to adjust power supply voltage is merely illustrative and does not serve to limit the scope of the present invention. In general, test data gathered from on-chip or off-chip test structures may be used to control any tunable knob on device 10 to compensate for PVT variations.

In certain embodiments, device measurements obtained using the steps of FIGS. 4 and 6 may be used to generate a unique fingerprint for a group of dies on a wafer (on which at least one test block 100 is formed) or for each individual die (on which test block 100' is formed). Since each die or each group of dies exhibits a one-of-a-kind variation pattern, a unique fingerprint can be created based on the measurement parameters. This fingerprint may be used as a "physically unclonable function" (PUF) as a security feature to differentiate from other devices.

Figure 7:
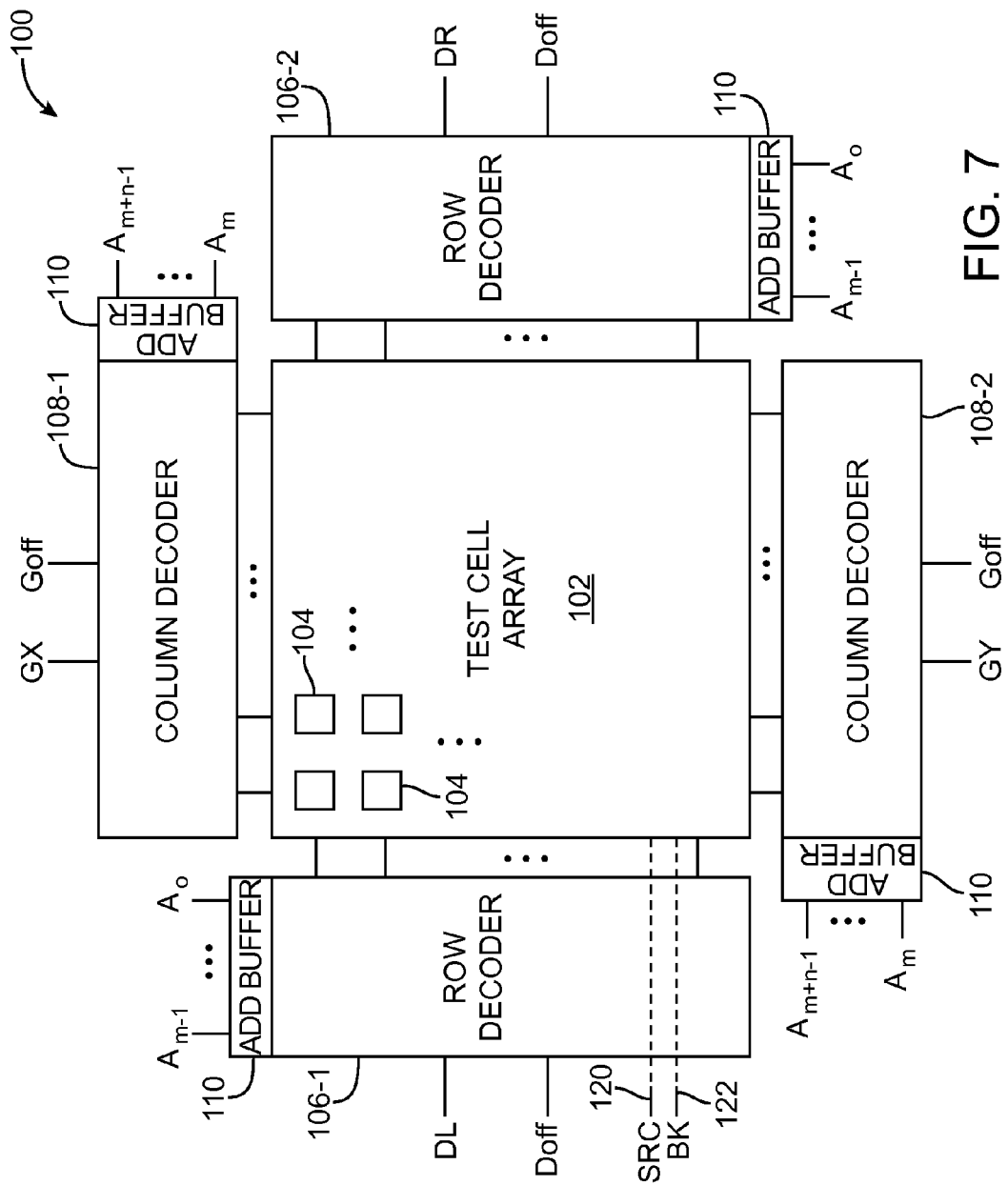
FIG. 7 is a diagram of illustrative addressable circuitry under test in accordance with an embodiment of the present invention.

An illustrative test block 100 that may be formed as wafer scribe line circuitry under test (FIG. 3) and that may be formed as on-chip circuitry under test (FIG. 5) is shown in FIG. 7. As shown in FIG. 7, circuitry 100 may include a test cell array 102 (e.g., an array of devices under test), a first row decoding circuit 106-1 (i.e., the row decoder at the "left" of array 102), a second row decoding circuit 106-2 (i.e., the row decoder at the "right" of array 102), a first column decoding circuit 108-1 (i.e., the column decoder at the top of array 102), and a second column decoding circuit 108-2 (i.e., the column decoder at the bottom of array 102). In other words, column decoders 108-1 and 108-2 are formed along opposing edges of array 102.

Array 102 may include unit test cells 104 arranged in rows and columns. In general, array 102 may include hundreds or thousands of test cells 104. Test cells 104 may include representative test structures from which desired parametric measurements may be obtained. In one suitable arrangement, each unit test cell 104 may include at least one transistor having a drain terminal, a gate terminal, a source terminal, and a bulk (or body) terminal.

In the example of FIG. 7, each test transistor in array 102 may have a drain terminal that receives a row control signal from row decoder 106-1 via a corresponding row line and a gate terminal that receives a gate control signal from a selected one of column decoders 108-1 and 108-2. The source (SRC) terminal of each transistor in array 102 may be coupled to a common line 120, whereas the bulk (BK) terminal of each transistor in array 102 may be coupled to a common line 122. The SRC and BK terminals may receive ground power supply signal Vss (as an example). If desired, the source and bulk signals may also be addressable using decoders and may receive voltage levels other than zero volts.

Left row decoder 106-1 may be coupled to an associated address buffer 110 that receives m address bits $A_0$-$A_{m-1}$. Row decoder 106-1 may also have a first input that receives left control signal DL and a second input that receives signal Doff. As an example, DL may be at logic "1," whereas Doff may be at logic "0." Decoder 106-1 that is controlled using m address bits may have $2^m$ row control lines, each of which is coupled to the drain terminals of transistors arranged along a corresponding row in array 102 (e.g., each row control line may be directly coupled to the test structures arranged in the corresponding row). Depending on the value of the m address bits, a selected one of the row control lines may be driven to DL while each of the remaining row control lines is driven to Doff. In some embodiments, Doff may be driven to a negative voltage level to further reduce leakage. These examples are merely illustrative. In general, DL can be at any voltage level that is required to measure the device parameter of interest. Similarly, Doff may be zero volts or any other voltage for deactivating the test structures.

Similarly, right row decoder 106-2 may be coupled to an associated address buffer 110 that receives the m address bits $A_0$-$A_{m-1}$. Row decoder 106-2 may also have a first terminal on which DR is provided and a second terminal on which Doff is provided. Decoder 106-2 may have $2^m$ row control lines that are shorted to the row control lines of decoder 106-2. Depending on the value of the m address bits, DR may be equal to the voltage signal on the selected row control line. Only one row may be selected at any given point in time.

Connected in this way, row decoder 106-1 may be used to apply or "force" a voltage onto the drain terminals of each transistor in a selected row (e.g., by biasing DL to a desired voltage level). Due to IR drop across the decoding path, the voltage that is actually applied at the selected drain terminals may be substantially lower than expected. Row decoder 106-2 may be used to read or "sense" the voltage that is actually applied at the selected drain terminals (e.g., by monitoring the value of DR). As an example, it is not uncommon for a DL at 1.2 V to yield a DR at 0.8 V due to IR drops. This configuration in which one terminal is being used to force a stress voltage and in which another terminal is being used to sense an actual applied voltage may provide useful information during parametric testing and may sometimes be referred to as exhibiting "Kelvin capability."

First column decoder 108-1 may be coupled to an associated address buffer 110 that receives n address bits $A_m$-$A_{m+n-1}$. Column decoder 108-1 may also have a first input that receives gate control signal GX and a second input that receives signal Goff. As an example, GX may be a high voltage signal, whereas Goff may be a low voltage signal. In some embodiments, Goff may be driven to a negative voltage level to further reduce leakage. Decoder 108-1 may have $2^{n-1}$ column control lines, each of which is coupled to the gate terminals of transistors arranged along a corresponding column in array 102 (e.g., each column control line may be directly coupled to the test structures arranged in the corresponding column). Depending on the value of the n address bits, a selected one of the column control lines may be driven to GX while each of the remaining column control lines is driven to Goff.

Similarly, second column decoder 108-2 may be coupled to an associated address buffer 110 that receives the n address bits $A_m$-$A_{m+n-1}$. Column decoder 108-2 may also have a first input that receives gate control signal GY and a second input that receives signal Goff. Decoder 108-2 may have $2^{n-1}$ column control lines, each of which is coupled to the gate terminals of transistors arranged along a corresponding column in array 102. Depending on the value of the n address bits, a selected one of the column control lines may be driven to GY while each of the remaining column control lines is driven to Goff.

Only n−1 bits are needed to address $2^{n-1}$ column control lines. The remaining bit determines which one of the column decoders 108-1 and 108-2 is currently being used to connect GX or GY to a selected one of the columns. For example, if the remaining bit is low, column decoder 108-1 may connect GX to a selected one of the associated columns while all columns associated with decoder 108-2 is connected to Goff. As another example, if the remaining bit is high, column decoder 108-2 may connect GY to a selected one of the associated columns while all columns associated with decoder 108-1 is connected to Goff. In general, signals GX and GY may be independent signals or may be the same signal when they are shorted to one another.

Configured in this way, the use of two column decoders at both sides of test array 102 enables twice the amount of test structures to be addressed in the column dimension, thereby doubling array density. The example of FIG. 7 is merely illustrative. In some embodiments, dummy rows and columns of test structures (e.g., test structures that will not actually be tested) may be added at the array edges to provide a more uniform layout for the test structures that are actually being tested. If desired, the left and right row decoders may provide separate address capabilities to effectively double the amount of addressable test structures in the row dimension instead of providing the Kelvin capability. If desired, the top and bottom column decoders may have column control lines that are shorted to each other to provide the Kelvin capability for the gate terminals instead of doubling the column-wise addressing capabilities. In general, the terms "rows" and "columns" merely refer to the relative orientation of circuits on a die and are interchangeable.

Figure 8:
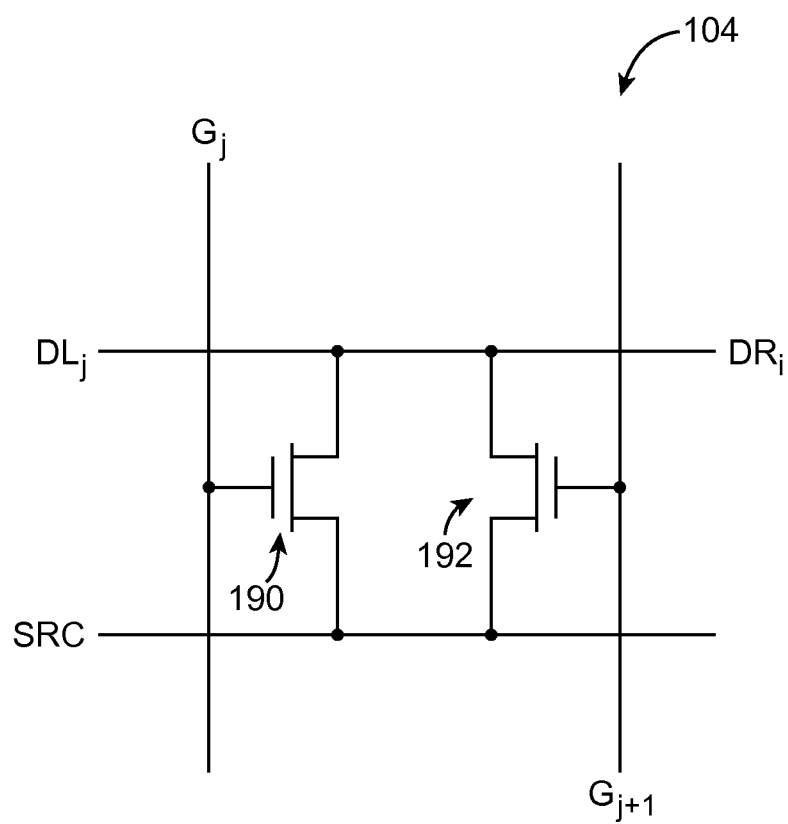
FIG. 8 is a diagram of an illustrative unit cell under test in accordance with an embodiment of the present invention.

FIG. 8 is a diagram of an illustrative unit test cell 104 that can be used in array 102 of FIG. 7. As shown in FIG. 8, cell 104 may include a first n-channel transistor 190 coupled in parallel with a second n-channel transistor 192. This is merely illustrative. Transistor 190 may be considered to be one unit test cell, whereas transistor 192 may sometimes be considered to be part of a separate unit test cell. Transistors 190 and 192 may have drain terminals that are coupled to a corresponding common row address line (e.g., a row line that receives signal $DL_i$ and outputs $DR_i$), source terminals that are coupled to a shared SRC line, and bulk terminals that are coupled to a shared BK line (not shown for clarity). Transistor 190 may have a gate terminal that receives $G_j$ from column decoder 108-1, whereas transistor 192 may have a gate terminal that receives $G_{j+1}$ from column decoder 108-2.

The arrangement of FIG. 8 is merely illustrative. In general, cell 104 may include other electronic components such as p-channel transistors, bipolar junction transistors, thin-film transistors, diodes, resistors, capacitors, inductors, memory cells, fuse circuits, sensors, a combination of these components, and other suitable devices. Parametric test equipment coupled to test block 100 may obtain any desired test measurements from each unit test cell 104. As examples, parameters than may be measured from each unit test cell 104 may include a transistor saturation current Idsat, a transistor linear current Idlin, a transistor threshold voltage level, a capacitance, a resistance, etc.

Figure 9:
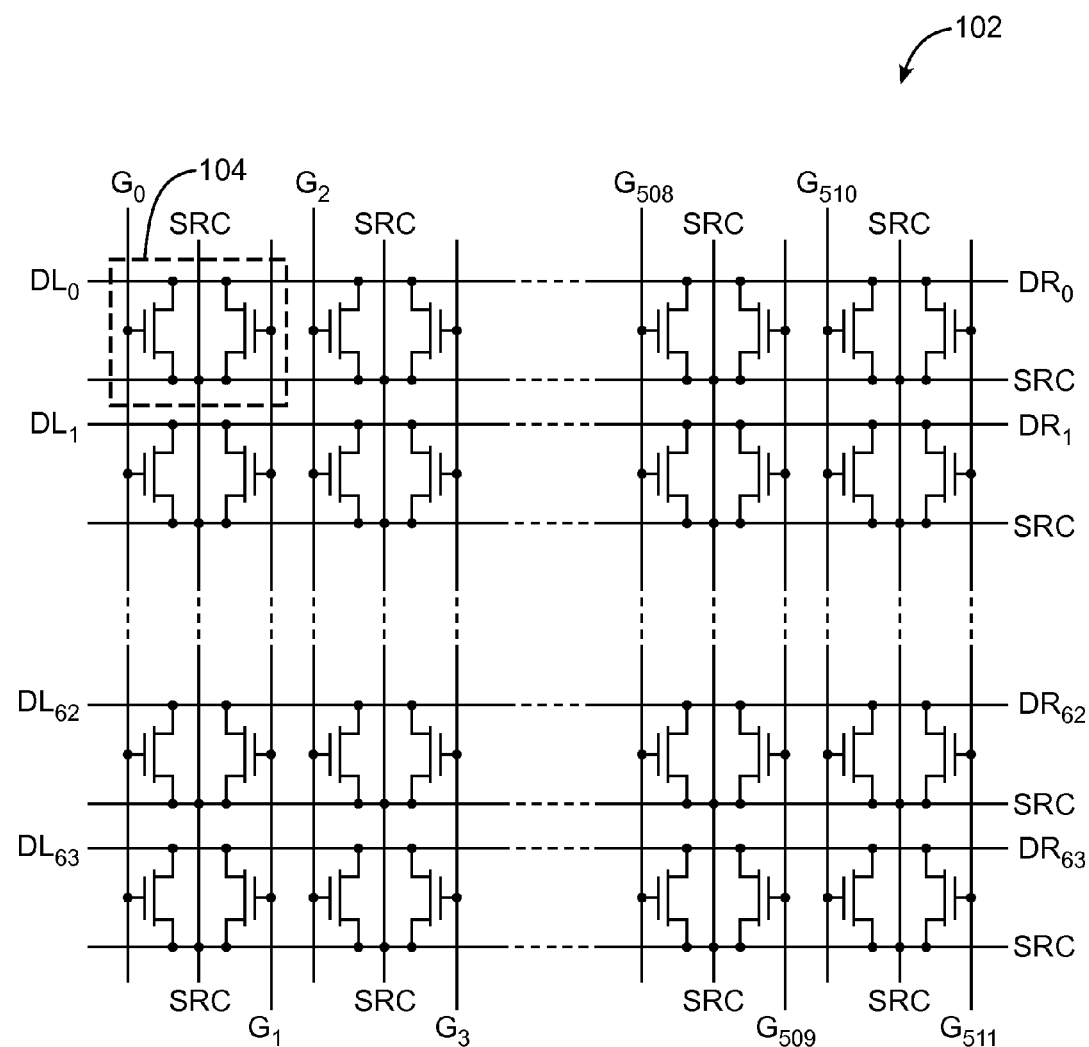
FIG. 9 is a diagram of an illustrative array of unit cells under test in accordance with an embodiment of the present invention.

FIG. 9 is a diagram that shows array 102 having unit test cells 104 of FIG. 8. In the example of FIG. 9, there are 64 row control lines that may be addressed using six (m=6) row address bits. There are 512 column control lines that may be addressed using nine (n=9) column address bits. In particular, half of the column control lines (i.e., the column lines associated with signals $G_0, G_2, \ldots, G_{510}$) may be addressed using column decoder 108-1, while the other half of the column control lines (i.e., the column lines associated with signals $G_1, G_3, \ldots, G_{511}$) may be addressed using column decoder 108-2.

As shown in FIG. 9, the SRC paths have all been shorted to create a common orthogonal mesh with low resistance. In general, the source and drain paths may be strapped in multiple metal routing levels to minimize resistance (e.g., to minimize IR drops). In arrangements in which all cells 104 can be formed in a single well, the bulk connection can be formed at the edge of array 102, in each sub-array, or in each unit cell. In arrangements in which fabrication design rules places an upper limit on the maximum well size, array 102 may be broken in sub-arrays and the bulk connection can be formed in each sub-array or in each unit cell.

The example of FIG. 9 in which array 102 includes only n-channel transistors is merely illustrative and does not serve to limit the scope of the present invention. In another suitable arrangement, array 102 may include at least some p-channel transistors. In the scenario in which p-channel transistors are being tested, the polarities of the bias voltages may be reversed. For example, the gate and drain voltages for selected p-channel transistor may be negative, whereas the gate voltage for unselected p-channel transistors can be zero or positive to minimize leakage). To implement this, the transistors in the row and column decoders may include p-channel transistors instead of n-channel transistors. Also, the address buffers that control the row and column decoders having p-channel transistors may be supplied with zero volts via a first power supply voltage terminal and with a negative power supply voltage (e.g., −2 V) via a second power supply voltage terminal. This example is merely illustrative. Other suitable voltages for biasing circuitry having p-channel transistors may be used, if desired.

Figure 10A:
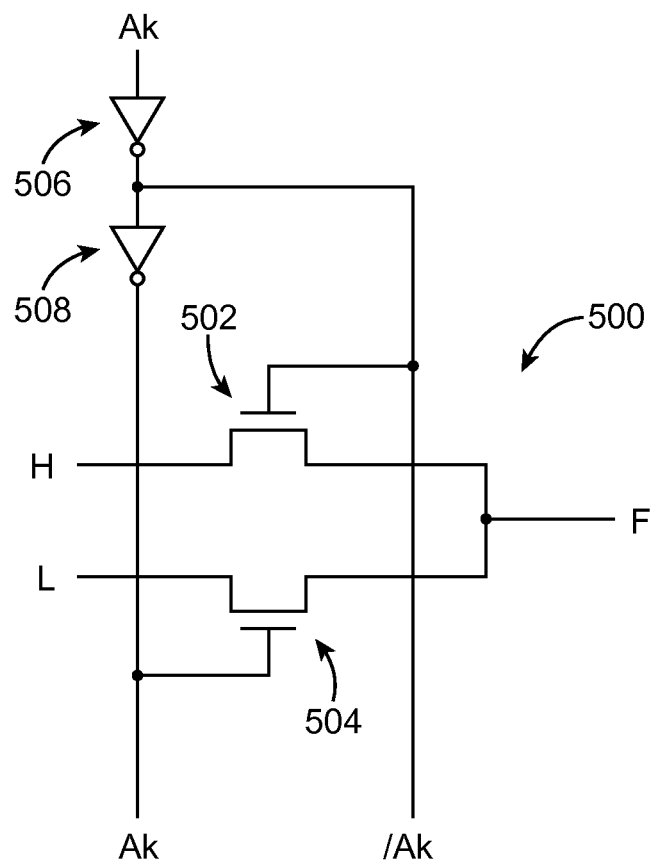
FIGS. 10A and 10B are diagrams of an illustrative multiplexing circuit in accordance with an embodiment of the present invention.

The row and column decoders in test block 100 may be formed using multiplexing circuits such as multiplexing circuit 500 of the type shown in FIG. 10A. As shown in FIG. 10A, multiplexer 500 may include a first pass transistor 502 and a second pass transistor 504. Pass transistors 502 and 504 may be n-channel transistors (as an example). Transistor 502 may have a first source-drain terminal that receives signal H, a gate terminal that receives an inverted version of address bit $A_k$ (i.e., $/A_k$ generated at the output of inverter 506), and a second source-drain terminal that is coupled to a multiplexer output F. Transistor 504 may have a first source-drain terminal that receives signal L, a gate terminal that receives a true version of address bit $A_k$ (i.e., $A_k$ generated at the output of inverter 508), and a second source-drain terminal that is coupled to multiplexer output F. Coupled in this way, multiplexer 500 may route signal H to its output when $A_k$ is low and may route signal L to its output when $A_k$ is high.

Typically, n-channel pass transistors exhibit a threshold voltage drop when passing high voltage signals. In order for voltage signals to be passed through multiplexer 500 without any threshold voltage drop, the address signals may be provided with elevated voltage levels (e.g., a voltage level Vddh that is higher than the nominal core positive power supply level Vddc that is used to power the majority of the logic circuitry on device 10). The voltage signals that are being applied to the drain and gate terminals of the test transistors in array 102 may still only toggle between zero volts and Vddc (as an example). Overdriving the pass transistors in multiplexer 500 helps to reduce multiplexer resistance. Transistors 502 and 504 may also be formed using input-output (I/O) transistors (e.g., transistors that have thicker gate oxides and longer channels than typical core transistors) in order to withstand the higher overdriven voltage at their gates.

Figure 10B:
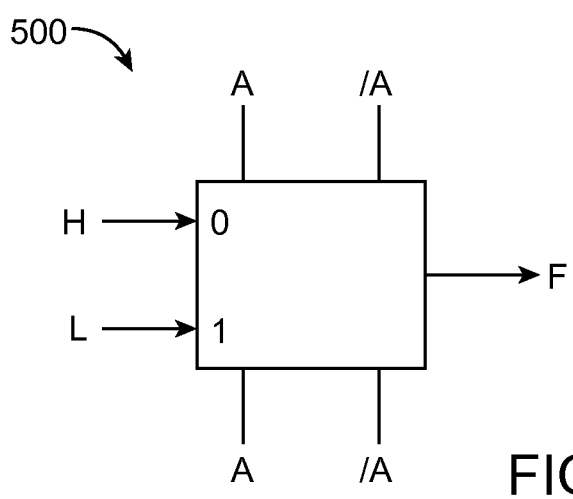
Figure 11A:
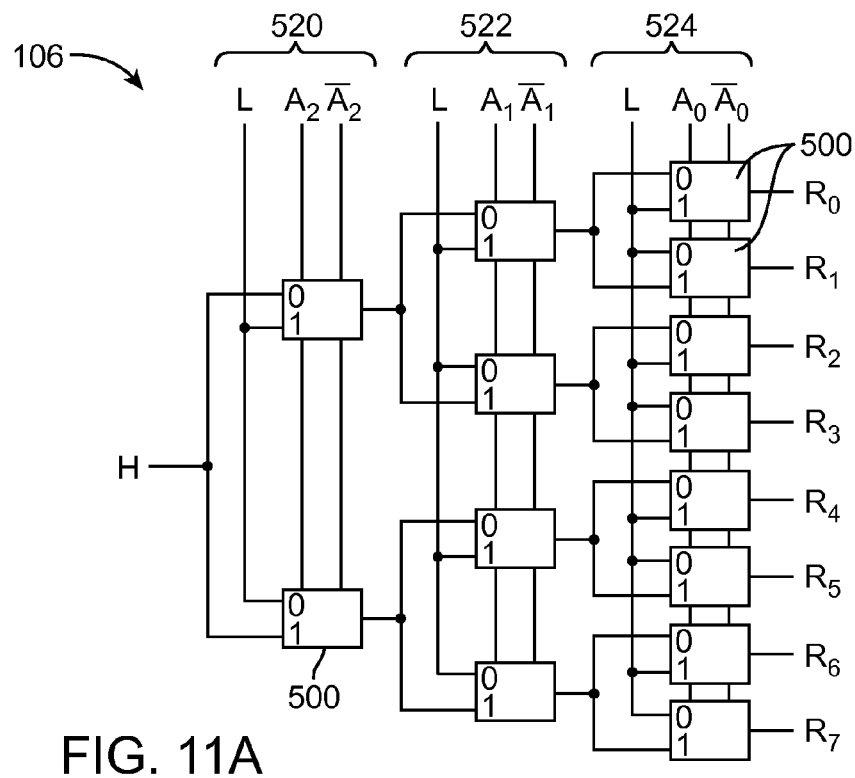
FIGS. 11A and 11B are diagrams of illustrative decoding circuits formed using multiplexing circuits of the type shown in FIG. 10B in accordance with an embodiment of the present invention.

FIG. 10B shows an equivalent block diagram for multiplexing circuit 500 of FIG. 10A. FIG. 11A shows how row decoding circuit 106 may be implemented using a tree of multiplexing circuits 500. Formed in this way, decoder 106 may be formed using only pass transistors (e.g., the address circuitry need not include any CMOS logic gates). As shown in FIG. 11A, a 3-bit addressable row decoder 106 may include a first decoding stage 520 formed using two multiplexers 500, a second decoding stage 522 formed using four multiplexers 500, and a third decoding stage 524 formed using eight multiplexers 500. The first, second, and third decoding stages connected in this way may be referred to as being connected in series. Connected using the arrangement of FIG. 11A, signal H may be passed to a selected one of row control lines $R_0$-$R_7$ while the remaining row control lines are driven to L depending on the value of address bits $A_2A_1A_0$. For example, if $A_2A_1A_0$ is equal to "001", only $R_1$ may be selected. As another example, if $A_2A_1A_0$ is equal to "110", only $R_6$ may be selected.

Figure 11B:
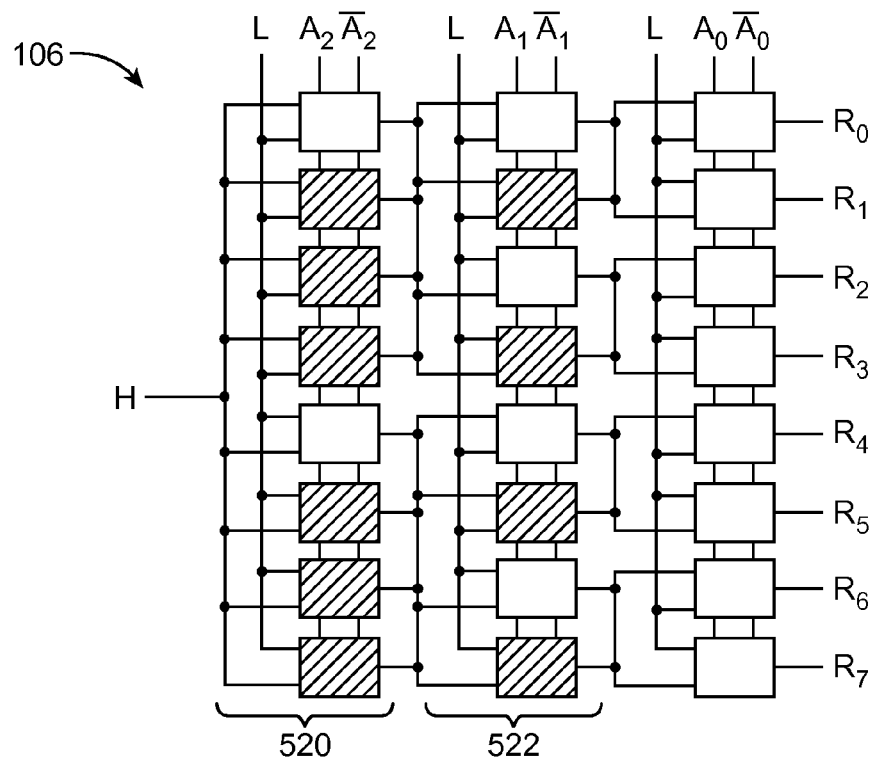

FIG. 11B shows another suitable arrangement of row decoder 106 in which additional multiplexing circuits 500 have been inserted (see, shaded multiplexers 500). As shown in FIG. 11B, six multiplexers 500 have been replicated and added in parallel to first decoding stage 520, whereas four multiplexers 500 have been replicated and added in parallel to second decoding stage 522. This arrangement provides a more regular structure, which improves manufacturability and substantially reduces decoder resistance without changing the functionality of decoder 106.

Figure 12:
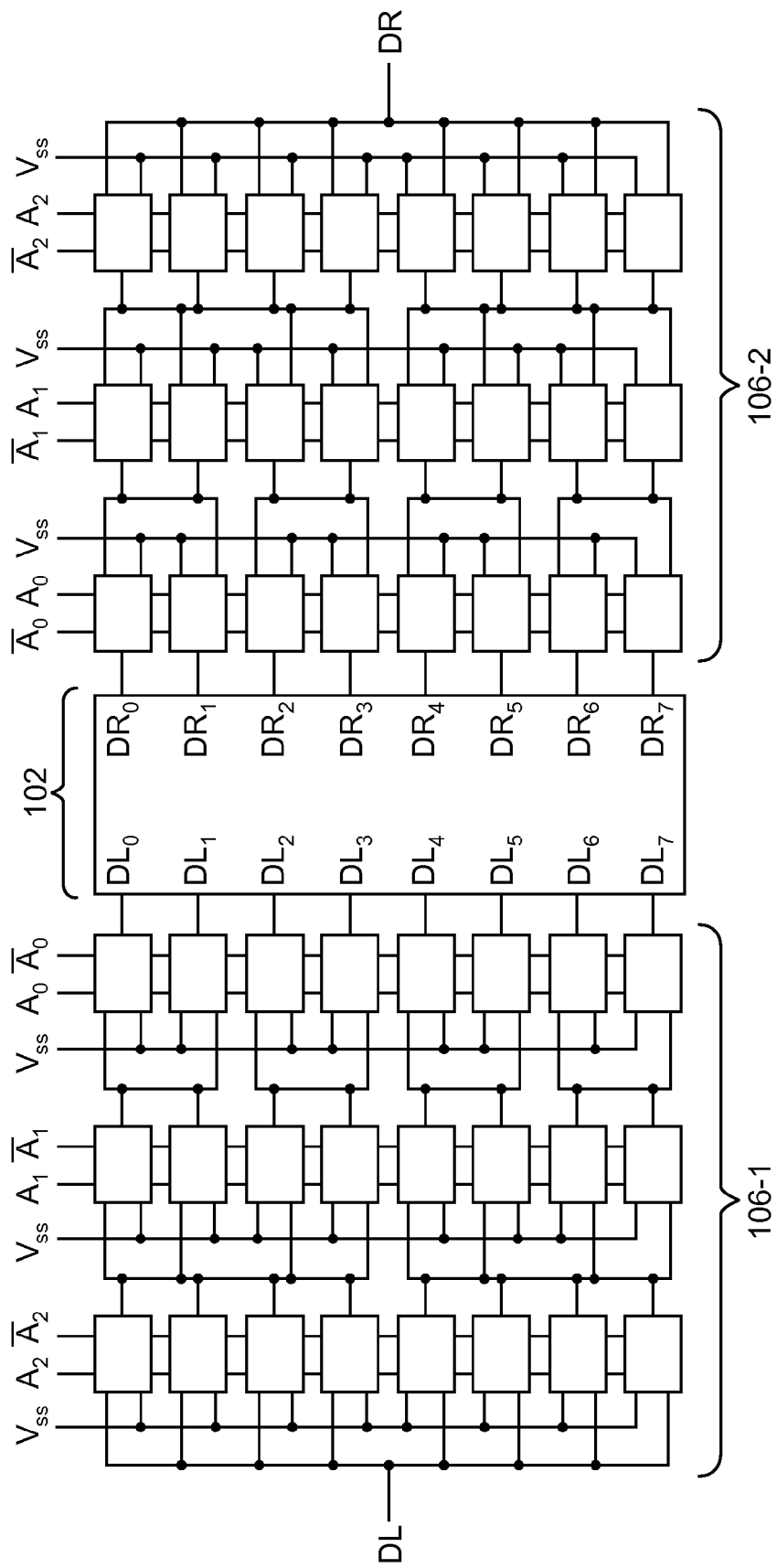
FIG. 12 is a diagram of illustrative addressable circuitry under test that is implemented using row decoders of the type shown in FIG. 11B in accordance with an embodiment of the present invention.

FIG. 12 is a diagram showing how array 102 may be coupled to left and right row decoders of the type shown in connection with FIG. 11B. The DL lines may be shorted to the DR lines. As described above in connection with 7, forcing a voltage DL on one side and sensing DR on the other side of a selected row enable Kelvin capability. Moreover, having separate access enables software or hardware feedback to set the force voltage at a level that achieves the desired target voltage at the structure under test. If desired, the DR lines may be separate from the DL lines to provide increased row-wise density but would disable the Kelvin capability since Kelvin capability requires the same row to be accessed from both sides simultaneously (e.g., having split row decoders to enable two independent row control lines in a single decoder pitch).

Figure 13:
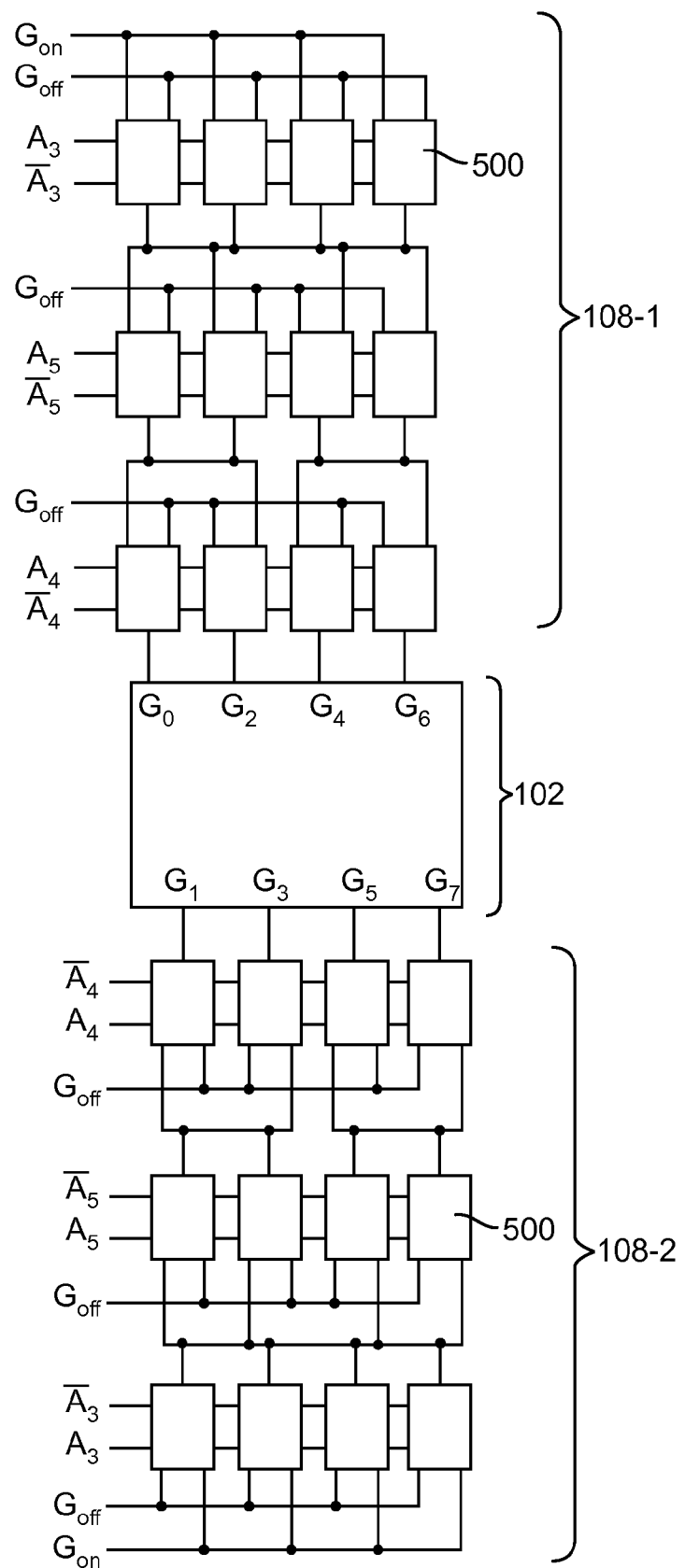
FIG. 13 is a diagram of illustrative addressable circuitry under test that is implemented using column decoders of the type shown in FIG. 11B in accordance with an embodiment of the present invention.

FIG. 13 is a diagram showing how array 102 may be coupled to top and bottom column decoders of the type similar to that of FIG. 11B. The gate lines are split to provide two independent gate lines in a single decoder pitch (e.g., decoder 108-1 may be formed along the top edge of array 102, whereas decoder 108-2 may be formed along the bottom edge of array 102). In other embodiments, the gate lines from decoder 108-1 may be shorted to the gate lines from decoder 108-2 to provide Kelvin capability (e.g., duplicate column decoders may be used to access the same column simultaneously).

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs). Examples of programmable logic devices include programmable arrays logic (PALs), programmable logic arrays (PLAs), field programmable logic arrays (FPGAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The programmable logic device described in one or more embodiments herein may be part of a data processing system that includes one or more of the following components: a processor; memory; IO circuitry; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by ALTERA Corporation.

Although the methods of operations were described in a specific order, it should be understood that other operations may be performed in between described operations, described operations may be adjusted so that they occur at slightly different times or described operations may be distributed in a system which allows occurrence of the processing operations at various intervals associated with the processing, as long as the processing of the overlay operations are performed in a desired way.

The foregoing is merely illustrative of the principles of this invention and various modifications can be made by those skilled in the art without departing from the scope and spirit of the invention. The foregoing embodiments may be implemented individually or in any combination.

What is claimed is:
1. Circuitry, comprising:
   address circuitry formed using only pass transistors; and
   an array of structures under test, wherein each structure under test in the array is directly coupled to the address circuitry, wherein the address circuitry includes a first decoder circuit formed on a first side of the array and a second decoder circuit formed on a second side of the array that is different than the first side, and wherein at least some structures under test in the array has a terminal shorted to a common row line that is directly coupled to the first and second decoders.

2. The circuitry defined in claim 1, wherein each structure under test in the array comprises a single component selected from the group consisting of: a transistor, a diode, a resistor, a capacitor, and a memory cell.

3. The circuitry defined in claim 1, further comprising:
a wafer on which the array of structures under test is formed, wherein a plurality of integrated circuit dies are formed on the wafer, and wherein the array of structures under test is formed at a scribe line between two adjacent integrated circuit dies in the plurality of integrated circuit dies on the wafer.

4. The circuitry defined in claim 1, wherein the array of structures under test is formed within an integrated circuit, and wherein the integrated circuit further includes control circuitry that gathers measurement data from the array of structures under test.

5. The circuitry defined in claim 4, wherein the control circuitry generates control signals for adjusting power supply voltage levels that are being used to power the integrated circuit based on the gathered measurement data.

6. The circuitry defined in claim 1, wherein the address circuitry is formed from a plurality of multiplexing circuits.

7. The circuitry defined in claim 1, wherein the second side of the array opposes the first side.

8. The circuitry defined in claim 7, wherein a first group of structures under test in the array is controlled using the first decoder circuit, and wherein a second group of structures under test in the array is controlled using the second decoder circuit.

9. Apparatus, comprising:
decoder circuitry formed using only pass transistors, wherein the decoder circuitry comprises first and second decoding stages connected in series, and wherein the first and second decoding stages include multiplexing circuits;
an array of test cells that is addressed using the decoder circuitry; and
a measurement circuit for gathering test data from the array of test cells, wherein the measurement circuit generates information that is used to compensate for semiconductor manufacturing variations detected in the array of test cells.

10. The apparatus defined in claim 9, wherein the array of test cells and the measurement circuit are formed within an integrated circuit.

11. The apparatus defined in claim 9, wherein the array of test cells is formed on a wafer, and wherein the measurement circuit is part of external test equipment that gathers parametric test results from the wafer.

12. The apparatus defined in claim 9, wherein the first and second decoding stages include the same number of multiplexing circuits.

13. The apparatus defined claim 12, wherein the decoder circuitry further includes a first input that receives a first voltage signal and a second input that receives a second voltage signal, and wherein each multiplexing circuit in the first decoding stage has one input that receives the first voltage signal and another input that receives the second voltage signal.

14. The apparatus defined in claim 13, wherein each multiplexing circuit in the second decoding stage has one input that is coupled to at least some of the multiplexing circuits in the first decoding stage and another input that receives the second voltage signal.

15. A method of operating test circuitry that includes an array of devices under test and first and second decoding circuits, comprising:
during a first time period, selecting a first group of devices under test in the array using the first decoding circuit; and
during a second time period, selecting a second group of devices under test in the array using the second decoding circuit, wherein the first decoding circuit is formed along a first edge of the array, and wherein the second decoding circuit is formed along a second edge of the array that opposes the first edge.

16. The method defined in claim 15, wherein the test circuitry further includes a third decoding circuit formed along a third edge of the array and a fourth decoding circuit formed along a fourth edge of the array that opposes the third edge, the method further comprising:
with the third decoding circuit, applying a signal to a third group of devices under test in the array during a third time period; and
with the fourth decoding circuit, applying the signal to a fourth group of devices under test in the array during a fourth time period.

17. The method defined in claim 15, wherein the test circuitry further includes a third decoding circuit formed along a third edge of the array and a fourth decoding circuit formed along a fourth edge of the array that opposes the third edge, the method further comprising:
during each of the first and second time periods, applying a signal to a third group of devices under test in the array with the third decoding circuit and sensing a corresponding output signal from a selected device under test in the third group of devices under test with the fourth decoding circuit.

18. The method defined in claim 15, further comprising:
gathering test data from the selected devices under test; and
generating control signals that compensate for manufacturing variations detected in the array of devices under test by analyzing the gathered test data.

* * * * *